United States Patent
Kirchhoff

(10) Patent No.: US 6,673,693 B2
(45) Date of Patent: Jan. 6, 2004

(54) METHOD FOR FORMING A TRENCH IN A SEMICONDUCTOR SUBSTRATE

(75) Inventor: Markus Kirchhoff, Ottendorf-Okrilla (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/917,554

(22) Filed: Jul. 27, 2001

(65) Prior Publication Data

US 2002/0022338 A1 Feb. 21, 2002

(30) Foreign Application Priority Data

Jul. 27, 2000 (DE) .......................... 100 36 724

(51) Int. Cl.[7] .............................................. H01L 21/76
(52) U.S. Cl. ...................... 438/409; 438/404; 438/408; 438/239; 438/243; 438/248
(58) Field of Search .................... 438/409, 408, 438/404, 400, 239, 243–248

(56) References Cited

U.S. PATENT DOCUMENTS 5,242,863 A * 9/1993 Xiang-Zheng et al.
6,118,164 A * 9/2000 Seefeldt et al. ............. 257/417
6,277,703 B1 * 8/2001 Barlocchi et al. ........... 438/412

FOREIGN PATENT DOCUMENTS

WO PCT/DE96/00913 11/1996

OTHER PUBLICATIONS

C.M.A.Ashruf et al.: "Galvanic porous silicon formation without external contacts" Sensors and Actuators 74 (1999), pp. 118–122.

V.Lehmann et al.: "Formation Mechanism and Properties of Electrochemically Etched Trenches in n–Type Silicon", J.Electrochem. Soc., vol. 137, No. 2, Feb. 1990.

* cited by examiner

Primary Examiner—Long Pham
(74) Attorney, Agent, or Firm—Laurence A. Greenberg; Werner H. Stemer; Gregory L. Mayback

(57) ABSTRACT

A method for forming a trench in a semiconductor substrate includes configuring a mask on the substrate. The mask has a window in which a substrate surface is uncovered. The substrate is electrochemically etched proceeding from the substrate surface. A porous substrate is formed in a trench-shaped region proceeding from the substrate surface. The trench is formed by removing the porous substrate from the trench-shaped region.

4 Claims, 2 Drawing Sheets

METHOD FOR FORMING A TRENCH IN A SEMICONDUCTOR SUBSTRATE

BACKGROUND OF THE INVENTION

Field of the Invention

The present invention relates to a method for producing a trench in a semiconductor substrate.

Semiconductor substrates are used to form electronic circuits and memories. By way of example, DRAMs (Dynamic Random Access Memory) are used as memories. These are dynamic random access memories. A DRAM chip contains an array of memory cells which are configured in the form of rows and columns and are driven by word lines and bit lines. A DRAM memory cell usually contains a transistor connected to a capacitor. Two basic concepts are customary for the capacitors, one concept provides a so-called stacked capacitor and the second concept provides a so-called trench capacitor. In order to form a trench capacitor with a large capacitance, it is necessary to form the trench capacitor with a large capacitor area. Since the substrate surface used by a memory cell decreases step-wise, one possibility for increasing the capacitance of the trench capacitor consists in forming a deeper trench (deep trench), in the substrate.

To date, trenches have been etched in a substrate such as silicon by performing reactive ion etching (RIE). First, a hard mask is formed on the substrate surface in order to cover the regions of the substrate surface which are not to be etched. The patterning of the hard mask is usually effected conventionally using a resist mask and subsequent lithography. As a result of the progressive miniaturization of circuits and the associated decrease in the trench diameters, the aspect ratio (ratio of trench depth to trench diameter) of a capacitor can increase while the capacitance remains the same. What is disadvantageous in this case is that reactive ion etching can only form trenches with limited aspect ratio.

As an example, V. Lehmann and H. Voll, "Formation mechanism and properties of electrochemically etched trenches in n-type silicon" J. Electrochemical Society 137 (1990) 653, describe a method in which trenches are formed by electrochemically etching a substrate in electrolytes containing hydrofluoric acid. Trenches having a larger aspect ratio are made possible by this method, but this method cannot be performed economically because of its low etching rate and its high current consumption.

SUMMARY OF THE INVENTION

It is accordingly an object of the invention to provide a method for forming a trench in a semiconductor substrate which overcomes the above-mentioned disadvantageous of the prior art methods of this general type.

With the foregoing and other objects in view there is provided, in accordance with the invention, a method for forming a trench in a semiconductor substrate that includes the following steps: providing a substrate having a substrate surface; providing a mask having a window and configuring the mask on the substrate to define an uncovered portion of the substrate surface that is within the window; electrochemically etching the substrate, proceeding from the uncovered portion of the substrate surface that is within the window; forming a porous substrate in a trench-shaped region proceeding from the substrate surface; and completely removing the porous substrate from the trench-shaped region.

The present method for forming trenches involves electrochemically etching only 20% to 80% of the substrate that is configured in the trench. This is in contrast to the method described by Lehmann in which all of the substrate that is configured in the trench is etched. This is made possible by suitable variation of the process parameters. Since only a fraction of the substrate is electrochemically etched from the region of the trench, the throughput rate can be increased to a multiple and the current consumption can be reduced to a fraction. A porous substrate remains within the electrochemically etched trench region. Once the desired trench depth is reached, the electrochemical etching process can be ended. Afterward, the porous network of the substrate in the trench region can be removed very rapidly and without further lithographic exposure steps. The trench is advantageously formed with a shape corresponding to the porous trench-shaped substrate region previously formed.

The process sequence specified describes a novel fabrication process for trenches in microelectronics.

In accordance with an added feature of the invention, the porous substrate has a density of between 20% and 80% of the original substrate. The lower the amount of the substrate that is electrochemically etched by the etching, correspondingly, the lower is the amount of the current that is consumed. Consequently, the etching process is ended more quickly, which means economic advantages.

In accordance with an additional feature of the invention, the porous substrate in the trench is etched using an alkaline etchant. The advantage of the alkaline etchant is that it is suitable for removing a porous substrate from a trench.

In accordance with a further feature of the invention, KOH is used as the etchant. KOH is advantageously suitable for etching silicon.

In accordance with a further added feature of the invention, the porous substrate is oxidized and porous substrate oxide is formed. The porous substrate is advantageously oxidized into porous substrate oxide thereby enabling the use of further etchants that are suitable for removing substrate oxide.

In accordance with a further additional feature of the invention, the etchant contains hydrofluoric acid.

In accordance with a concomitant feature of the invention, the substrate contains silicon.

Other features which are considered as characteristic for the invention are set forth in the appended claims.

Although the invention is illustrated and described herein as embodied in a method for forming a trench in a semiconductor substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
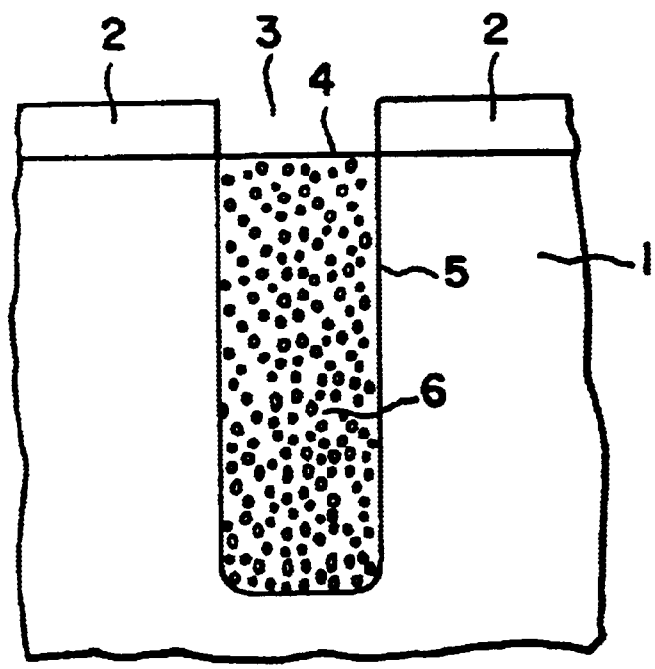
FIG. 1 shows a substrate with a trench-shaped porous substrate.

With the foregoing and other objects in view there is provided, in accordance with the invention, a substrate 1, on which a mask 2 having a window 3 is configured. The substrate surface 4 is uncovered in the window 3. A trench 5 is formed in the substrate 1 in the region of the uncovered substrate surface 4 and porous substrate 6 is configured in the trench 5.

A method for producing the configuration shown in FIG. 1 includes forming a mask 2 on the substrate 1. The mask 2 has a photolithographically produced window 3 through which the substrate surface 4 is uncovered. An anodic etching step is subsequently carried out using an electrolyte containing hydrofluoric acid. If the substrate 1 is composed of silicon, for example, then Si+4HF is converted into $SiF_4+4H^++4e^-$. The porous substrate 6 is produced in a trench-shaped region in the process.

Figure 2:
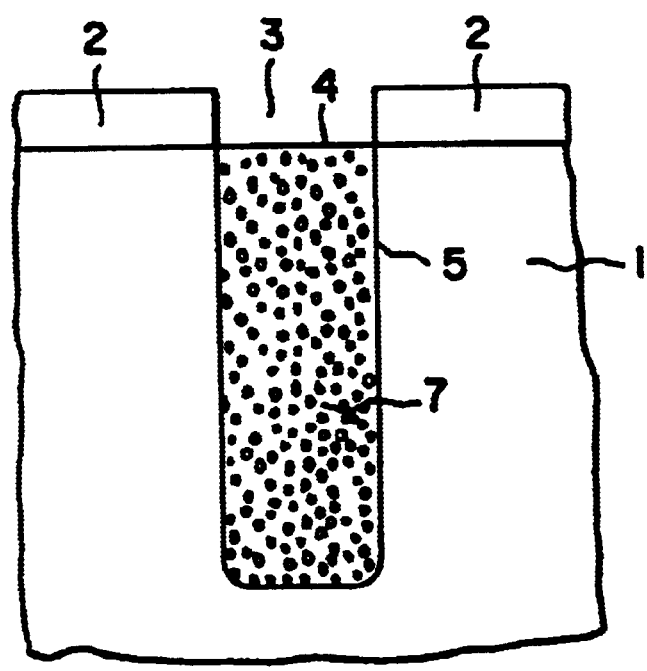
FIG. 2 shows a substrate with a porous oxidized trench-shaped substrate region.

FIG. 2 illustrates the substrate from FIG. 1. In FIG. 2, it is shown that the porous substrate 6 has been converted into porous substrate oxide 7 using an oxidation step. The conversion can be carried out using thermal oxidation, for example.

Figure 3:
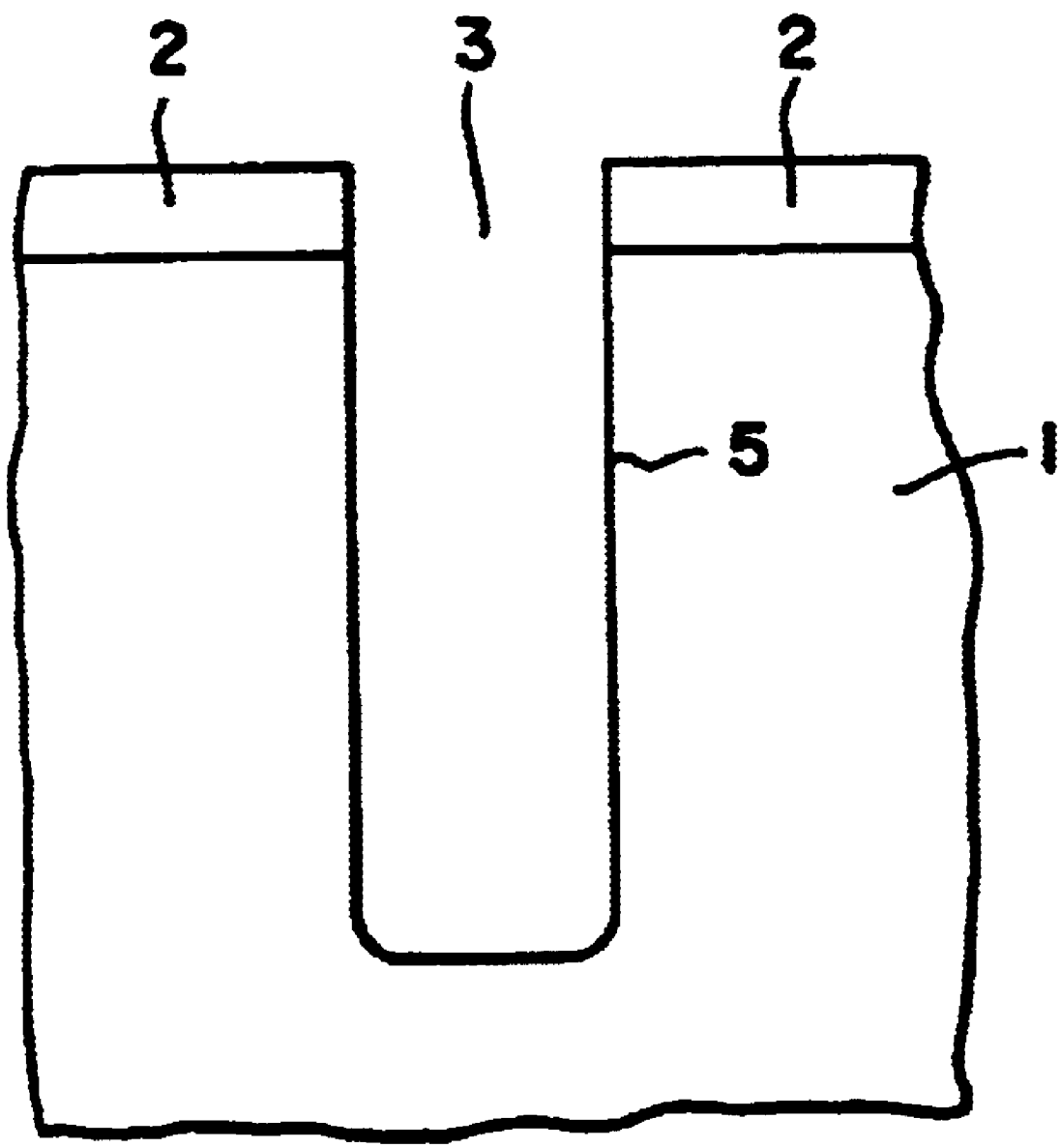
FIG. 3 shows a substrate with a trench.

With reference to FIG. 3, a further etching step has been carried out which, for example, converts the configuration illustrated in FIG. 1 into the configuration illustrated in FIG. 3 by etching out the porous substrate 6 from the trench-shaped region. In FIG. 3, the porous substrate 6 is in this case removed from the trench 5. It is likewise possible for the configuration that is illustrated in FIG. 2 and that has porous substrate oxide 7 in the trench 5 to be converted into the configuration illustrated in FIG. 3 by performing a suitable etching step in which, for example, hydrofluoric acid is used for etching silicon oxide.

I claim:

1. A method for forming a deep trench for a trench capacitor in a semiconductor substrate, which comprises:

providing a substrate having a substrate surface;

providing a mask having a window and configuring the mask on the substrate to define an uncovered portion of the substrate surface that is within the window;

electrochemically etching the substrate, proceeding from the uncovered portion of the substrate surface that is within the window, by using an electrolyte containing hydrofluoric acid to form a porous substrate in a trench-shaped region proceeding from the uncovered portion of the substrate surface;

oxidizing the porous substrate to form porous substrate oxide; and etching the porous substrate oxide using hydrofluoric acid.

2. The method according to claim 1, which comprises performing the step of forming the porous substrate such that the porous substrate has a density of between 20% and 80% of that of the substrate.

3. The method according to claim 1, which comprises including silicon in the substrate.

4. The method according to claim 1, wherein the porous substrate is converted into the porous oxide using thermal oxidation.

* * * * *